United States Patent [19]

Brown

[11] Patent Number: 4,554,507

[45] Date of Patent: Nov. 19, 1985

[54] ARRANGEMENT FOR TESTING THE OPERABILITY OF A SEMICONDUCTIVE DEVICE

[75] Inventor: Christopher R. Brown, Chippenham, England

[73] Assignee: Westinghouse Brake and Signal Co., Ltd., Chippenham, England

[21] Appl. No.: 439,702

[22] Filed: Nov. 8, 1982

[30] Foreign Application Priority Data

Nov. 14, 1981 [GB] United Kingdom ............... 8134401

[51] Int. Cl.$^4$ .................... G01R 31/26; G08B 21/00
[52] U.S. Cl. .............................. 324/158 SC; 340/516; 340/645
[58] Field of Search ................ 324/158 D, 158 SC; 340/514, 515, 516, 644, 645; 361/100; 363/54, 57

[56] References Cited

U.S. PATENT DOCUMENTS

| | | | |
|---|---|---|---|
| 3,238,520 | 3/1966 | Van Vlodrop | 340/645 |
| 3,648,233 | 3/1972 | Clark | 340/644 |
| 4,025,845 | 5/1977 | Lhommelet et al. | 324/133 |
| 4,415,844 | 11/1983 | Delin et al. | 340/516 |

Primary Examiner—Ernest F. Karlsen
Attorney, Agent, or Firm—J. B. Sotak

[57] ABSTRACT

An arrangement for checking the integrity and operability of a semiconductive device including a control circuit for injecting test signals into a normal control signal to induce a momentary change of the operating condition of the semiconductive device, a sensing circuit connected in parallel with the semiconductive device sensitive to an induced change to produce an output indicating the induced change, and a correlation circuit operative to correlate the test pulses with the sensed response which is arranged to carry out predetermined action in the event that the correlation circuit determines a state of inoperability of the semiconductive device.

20 Claims, 6 Drawing Figures

LED CURRENT VS. TIME

PHOTOTRANSISTORS COMBINED OUTPUTS

4,554,507

ARRANGEMENT FOR TESTING THE OPERABILITY OF A SEMICONDUCTIVE DEVICE

FIELD OF THE INVENTION

This invention relates to apparatus for testing the operability of a semiconductive device, and more particularly to a circuit arrangement which is used for driving the control signal line of a signal lamp or switch point in a railway network.

BACKGROUND OF THE INVENTION

Traditionally, control signal lines for railway signal lamps and switch points have been driven from a power supply via the contacts of an electromagnetic control relay. Such relays have been developed over a number of years using special techniques and materials so that these relays presently in use are fail-safe in their operation. The occurrence of failures has been reduced to an extremely low level and the fail-safe design of the relays makes it entirely certain that a relay will fail in a predetermined manner which is always arranged to be the most restrictive condition or safe state.

However, the ever rising costs of production and materials relative to those involved in producing semiconductive devices have now made it desirable to seek ways, wherever possible, to replace relays with the cheaper solid-state devices. The problem which arises is that a semiconductive device per se cannot be made to fail to a predetermined state and hence are not inherently fail-safe. Therefore, electronic circuits have to be designed as a whole to adopt a predetermined state upon a semiconductive device failing.

A drawback in the context of railway signal interlocking systems is that long, sometimes extremely long, periods of time elapse in which railway light and switch point control signals have to remain in one or another state. In these circumstances, the problem which arises is that if a semiconductive device is in a saturated state, and fails such that it would in its failed condition, then also occupying that state, its failure will not be detected until the interlocking system next tries to change the state of that signal.

OBJECT AND SUMMARY OF THE INVENTION

Accordingly, it is an object of the present invention to overcome these problems by providing means and apparatus for periodically or continually testing the operability of a semiconductive device which would otherwise continuously remain in a saturated condition.

According to the present invention, there is provided apparatus for testing the operability of a semiconductive device comprising, means for injecting test pulses into a normal control signal to induce a momentary change of the operating state of the semiconductive device, sensing means connected in parallel with the semiconductive device sensitive to an induced change to produce an output indicating such change, and correlation means operative to correlate the test pulses with the sensed response which is arranged to carry out predetermined action in the event that said correlation means determines a state of inoperability of the semiconductive device.

In one form of the invention, the sensing means comprises a light emitting diode, which is connected in series with a current limiting resistor across the device to be tested, wherein the sensing means output is the state of illumination from the diode, and the correlation means includes a photoresponsive device cooperating therewith.

DESCRIPTION OF THE DRAWINGS

The above object and other attendant features and advantages of the present invention will now be described by way of example only with reference to the accompanying drawings, in which.

DETAILED DESCRIPTION OF THE INVENTION

Figure 1:
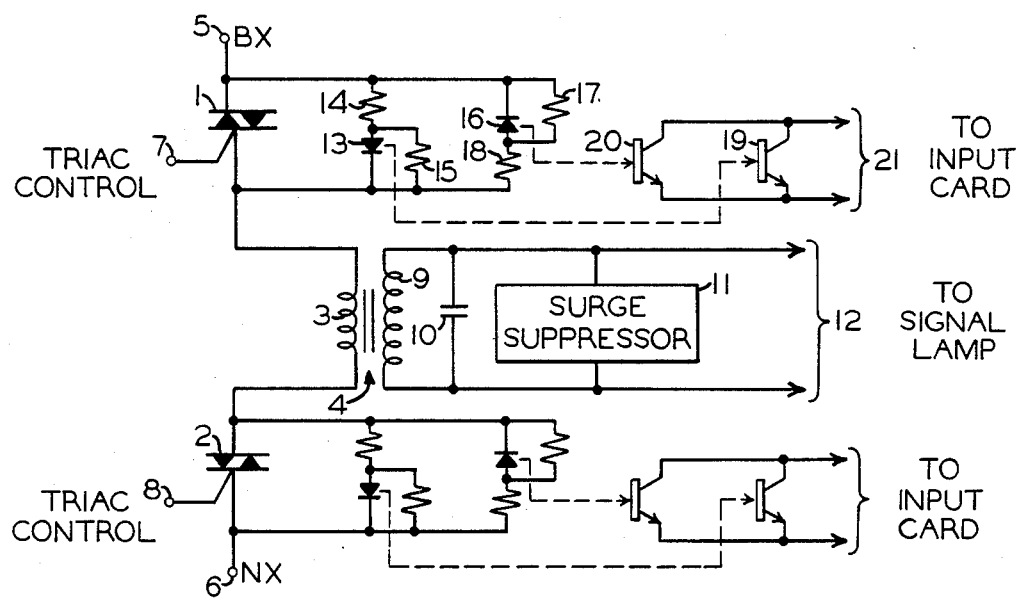
FIG. 1 shows a dual TRIAC driving arrangement with respective L.E.D. test sensors.

Referring now to the drawings, and in particular to FIG. 1, there is shown a dual TRIAC driving circuit arrangement. The driving circuit includes a pair of TRIACS 1, 2 which are serially connected on either end of a primary input winding 3 of a transformer 4. The whole series circuit is connected between a pair of a.c. power supply terminals 5 and 6 of a suitable voltage source BX–NX. Each TRIAC 1, 2 has a control circuit or terminal 7, 8, respectively, which receives a TRIAC base controlling signal from separate power sources, as will be described hereinafter. The transformer 4 provides a control line driving signal via its secondary output winding 9, which has connected across its terminals a filter capacitor 10 and surge suppression circuit represented by block 11, and is shown connected by a pair of signal carrying wires 12 to a load or control device which is labeled in the drawing "to signal lamp".

As shown, each of the TRIACS 1, 2 has an identical L.E.D. test sensor arrangement, one of which will now be described. Connected in parallel with TRIAC 1 is a light emitting diode (L.E.D.) 13 which is in series with a current limiting resistor 14, and in parallel with the L.E.D. 13 is a further resistor 15 which combines with the resistor 14 to form a voltage or potential divider, as will be described below. Also in parallel with TRIAC 1 is a further similar arrangement of L.E.D. 16 and two resistors 17 and 18, but in which L.E.D. 16 is connected in reverse polarity with the first L.E.D. 13. A phototransistor 19 is paired with L.E.D. 13 and a phototransistor 20 is paired with L.E.D. 16, as indicated by the dashed lines in FIG. 1. The phototransistors 19 and 20 are connected in parallel between a pair of signal lines 21 labeled "to input card".

In describing the operation of the circuit of FIG. 1, it will be seen that when it is desired to provide a control signal on signal lines 12, the TRIACS 1 and 2 are both "fired", i. e., rendered conductive so that a.c. current flows between terminals 5 and 6 through the primary input winding 3 of transformer 4. This induces an a.c. voltage across the terminals of the secondary output winding 9 which feed the required control signal to the lines 12.

If energization of control lines 12 requires a red aspect signal lamp to be displayed, the control signal may be present for some considerable period of time, in which case TRIACS 1 and 2 must remain continuously conducting. Therefore, the control signals supplied to TRIAC control terminals 7 and 8 will also remain continuously energized so that the TRIACS continue to conduct in each new half cycle. One possible TRIAC failure mode is a short circuit, in which case the same effect would apparently be produced since the TRIAC would continuously conduct, and the fault would not be discovered until the base control signal is next removed in an attempt to extinguish the prior conduction.

In order to diagnose such a condition, a narrow test pulse is introduced into the control signal on the TRIAC base control terminal, switching it to the "OFF" state. The narrow pulse is sufficiently long, e.g., in the order of 20 ms, so that the TRIAC will be momentarily extinguished.

When a TRIAC is conducting, only a small forward diode voltage drop appears across its end terminals, which in FIG. 1 appears across the ends of potential divider chains comprising resistors 14, 15 and 17, 18. Depending upon which half cycle of the a.c. voltage is producing the conductive current, this voltage will have a corresponding polarity. However, providing the TRIAC is conducting, the voltage appearing across the section of the potentiometer chains in parallel with L.E.D.'s 13 and 16, will be too small to cause either of these to conduct, therefore, neither will be illuminated.

If now the TRIAC fails in an open circuit condition in one direction and cannot conduct, on say, the forward half cycle when terminal 5 is positive with respect to terminal 6, then in this case, a much larger voltage will appear across the ends of potentiometer chain 14 and 15, and correspondingly across L.E.D. 13 which is thereby caused to emit light. The emitted light is received by phototransistor 19, which responds by switching from its normally nonconducting state to a conducting state, thus permitting current to flow in a loop from one of the lines 21 to the other.

The same result is produced if the TRIAC fails in an open circuit condition for conduction in the opposite direction, in which case L.E.D. 16 becomes illuminated, and if the TRIAC fails as an open circuit for conducting in both directions, in which case both L.E.D.'s 13 and 16 are illuminated, and phototransistors 19 and 20 switch on to conduct current around the loop through lines 21. An identical sequence of events takes place with respect to the sensor circuits shown connected across TRIAC 2.

Figure 2:
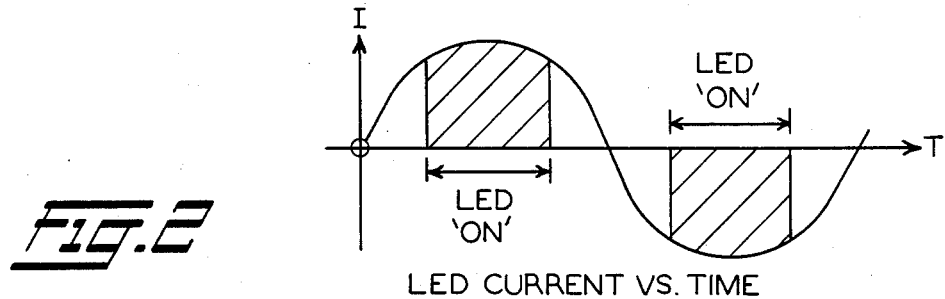
FIG. 2 shows a curve of current versus time for the L.E.D.s in FIG. 1.
Figure 3:
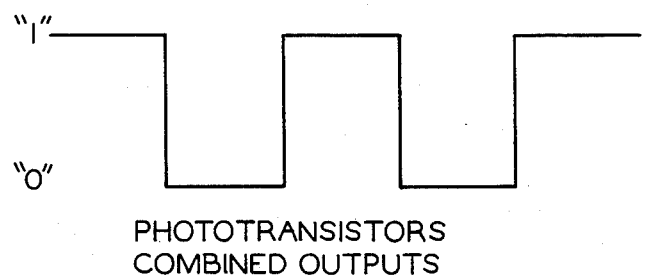
FIG. 3 shows the combined phototransistor outputs for each test sensor for each TRIAC.

In the absence of a potentiometer chain disassociated with each L.E.D., it would conduct for virtually a whole half cycle of a.c. supply voltage, and as the zero crossing point of an a.c. voltage is its steepest part, the changeover of illumination between L.E.D.'s 13 and 16 would be almost instantaneous with the result that the combined output of phototransistors 19 and 20, feeding into lines 21, will be substantially constant. In order to clearly differentiate between the L.E.D.'s energized in alternate half cycles of the a.c. supply, the potentiometer chains are chosen so that each L.E.D. experiences an energizing voltage for substantially less than a complete half cycle, as can be seen from FIG. 2, in which it can be seen that the total period during which both L.E.D.'s are extinguished is approximately equal to the period during which each L.E.D. is energized. The result is to produce a substantially square-wave output on lines 21 during the period that test pulses are injected into the TRIAC control terminal and the TRIAC is functioning correctly. This square-wave signal produced by the combined outputs of phototransistors 19 and 20 is shown in FIG. 3.

Figure 4:
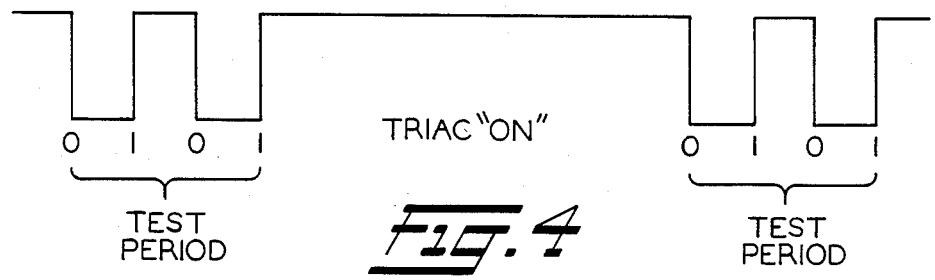
FIG. 4 shows the test results for an "ON" state TRIAC.
Figure 5:
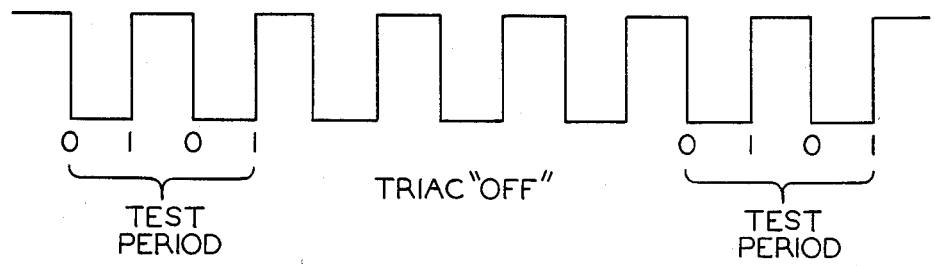
FIG. 5 shows the test waveform for an "OFF" state TRIAC.

FIGS. 4 and 5 show the output observed on signal lines 21 in response to a single test pulse injected into a TRIAC base control terminal when the TRIAC is "ON" in FIG. 4 and "OFF" in FIG. 5. The frequency of the a.c. supply is 50 Hz and the approximate width of the test pulse is 20 ms. In the conditions of FIG. 4, when the TRIAC is normally continuously conducting, the test L.E.D.s are normally extinguished in response to injection of the test pulse, first one and then the other of L.E.D.'s 13, 16 will be illuminated in the manner shown in FIG. 2. Preferably the test pulses are synchronized with a zero crossing point of the a.c. supply waveform. Thus, using a binary notation in FIG. 4, the normal state of the signal on lines 21 will be FIG. 1, and assuming the TRIAC is functioning correctly in response to a test pulse, the binary sequence 0101 will be produced.

Referring now to FIG. 5, it will be seen that when a TRIAC is not conducting, i.e., is blocking the supply voltage, an alternating voltage will normally appear across the L.E.D.'s 13, 16, in which case they will be alternately energized, producing an alternating binary signal on lines 21, and in response to injection of a test signal into the TRIAC base control, thus the same test sequence 0101 will be produced as before.

If the TRIAC has failed as a short circuit, it will not be possible for the test pulses to momentarily extinguish its conduction so that the sequence 0101 will not appear on the lines 21, and so correlation of the test pulse with the test results will indicate TRIAC failure.

Figure 6:
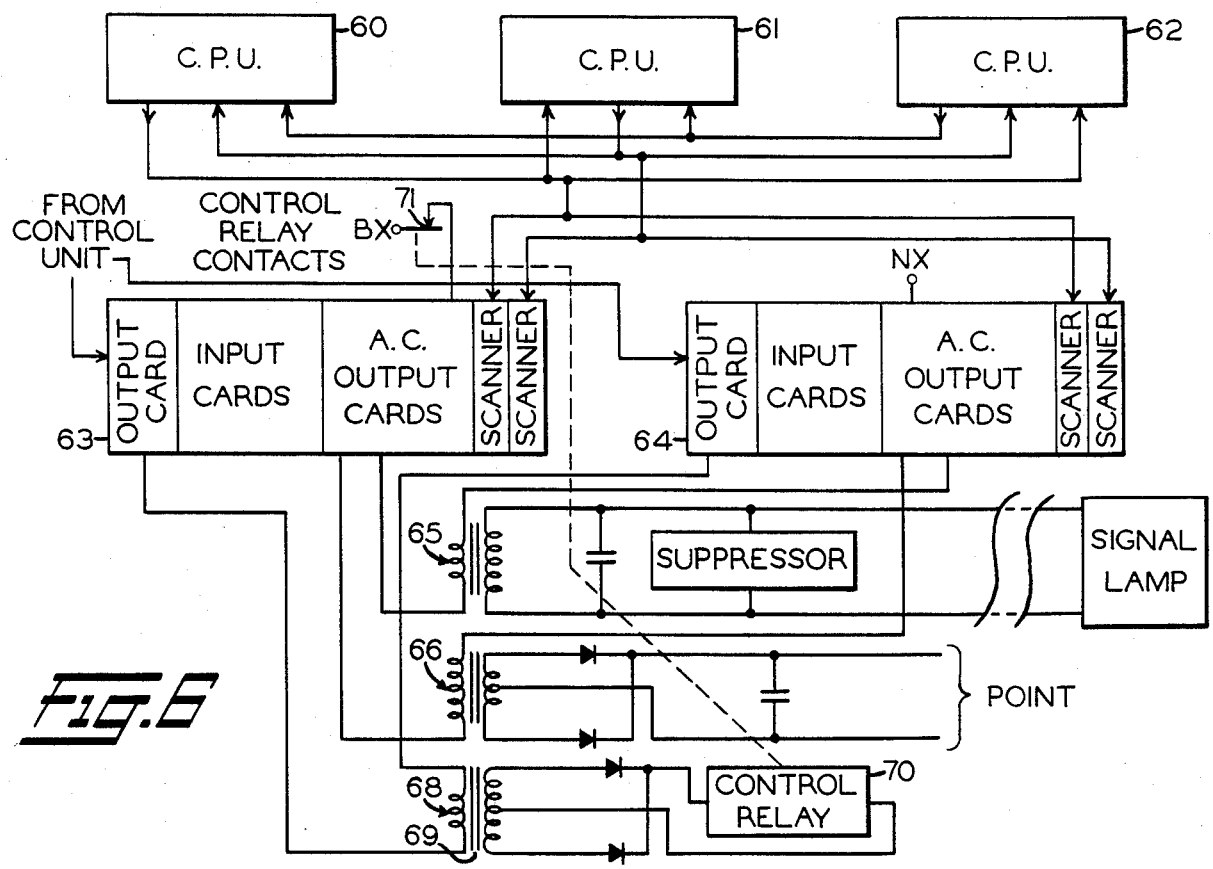
FIG. 6 shows a block diagram of a computer based railway signal interlocking system employing solid-state control line drivers.

Referring now to FIG. 6, which shows a block diagram of a computer based railway interlocking system employing solid-state control line drivers. As shown, the references 60, 61 and 62 indicate three parallel redundant computer processing units programmed to execute software programs for the interlocking of lamp and point control signals to eliminate the possibility of conflicting train movements arising within the control network. Each processing unit produces a stream of serial binary data output information comprised basically of an address code indicating the traffic control element, i.e., signaling lamp or switch point, and the binary word representing the desired control signal. The three parallel streams of binary information are cross-checked to determine and check which is a correct signal, as has been described elsewhere, and the information is demultiplexed from serial to parallel by electronic circuitry in housings indicated by references 63, 64 which are arranged to cooperate in a fail-safe manner to drive a set of parallel control signal lines each designated to a signaling lamp or switch points in the railway network.

The two electronic housings 63, 64 are essentially electrical and contain a multiplicity of printed circuit boards organized into batches of similar cards according to their respective functions. Thus, each contains a card labeled "scanner", whose job is to receive serial information from the processing units 60, 61 and 62 and distribute the information as appropriate to the appropriate function on one of the other circuit cards which are arranged in parallel. A section of these other cards labeled "input cards" is of no concern here, other cards labeled "A.C. output cards" which contain, amongst other things, a TRIAC, such as 1, and its associated L.E.D. test sensor circuits and phototransistors. As mentioned in connection with FIG. 1, each control line driver employs two TRIACS, one of which is located in housing 63 and the other of which is located in housing 64. As will be seen in FIG. 6, housing 63 is connected to the a.c. supply at the terminal labeled BX and housing 64 is connected to the opposite terminal of the a.c. supply at NX. To complete a circuit for a one line driver, a TRIAC in housing 63 and a corresponding TRIAC in housing 64 are connected to opposite ends of a line driver transformer 4 in the manner described in connection with FIG. 1. In FIG. 6, one such driver 65 for a signaling lamp is shown, and another driver 66 for a switch point is shown, but it is to be understood that these are only one of a multiplicity of each type.

The operation of the system is that the scanner card of each housing receives a signal from the processing unit outputs, and according to the address code, directs it to the appropriate a.c. output card to actuate the control circuit of the appropriate TRIAC. Thus, in normal operation, to provide a control signal from driver 65, a TRIAC will be fired in housing 63, and a corresponding TRIAC will be fired in housing 64, which TRIACS together complete an a.c. circuit from a.c. supply terminal BX through transformer 4 to supply terminal NX.

The testing of the TRIACS is carried out as described above and the combined phototransistor output signal on lines 21 is supplied to correlation means located on one of the input cards, the correlation means being operative to check that the binary test sequence 0101 occurs coincident with a test pulse being applied to the TRIAC.

The use of two housings 63, 64, each having one of two TRIACS needed to energize a control line driver, confers a degree of fail-safe protection, since if one of the TRIACS fails as a short circuit, the other will still be able to energize and deenergize the control line driver alone. Thus, two coincident failures in two separate electronic housings are necessary before a dangerous condition can occur. If, on the other hand, one of the TRIACS should fail as an open circuit, then under no circumstances can the control line driver become energized, and thus has occurred a failure to a safe or more restrictive condition.

In the event of a TRIAC failing as a short circuit, so that a test pulse cannot momentarily extinguish it, this fact will be registered on line 21 by the absence of test sequence, and the correlation means can undertake to produce an output controlling action deemed appropriate under the circumstances. There are two possible courses of action, firstly, in the event of failure in either TRIAC controlling a line driver, the whole line driver may be shut down, or alternatively, the line driver may be left under the control of the single remaining operational TRIAC and an appropriate warning given of the failed TRIAC. The decision as to which of these courses to adopt is a matter of philosophical approach, and the correlation means, or the means responsive thereto, may be arranged to operate according to the preferred course. Should it be desired to suspend complete operation of the line driver, the arrangement shown in FIG. 6 may be adopted, in which the correlation means in either housing 63, 64 signals a circuit in a section marked "output card" to extinguish a TRIAC in the energizing circuit of a control relay driver 68, much in the same manner as FIG. 1. In this circuit, there is a TRIAC in housing 64 connected in series with the input winding of the transformer 69, and a further TRIAC in housing 63, both TRIACS being controlled in similar manner, and being normally conducting to maintain a control relay 70 normally energized. The closed when energized contacts 71 of this relay are connected in the power supply line for the appropriate line driver. Thus, in operation, when one of the two correlation means associated with the control line driver of a traffic control element senses that one of the two TRIACS has failed as a short circuit, it removes the base control signal from a further TRIAC on the corresponding "output card" which causes the controlled relay driver 68 to deenergize the relay 70 for releasing contacts 71 and removing the a.c. power supply to the traffic control element line driver. As the circuit 68 also has two TRIACS controlling its energization on an energized to hold basis, it possesses the lowest probability of a wrong side failure affecting performance, since for a wrong side failure, it would require a control line TRIAC to fail as a short circuit and the corresponding control relay circuit TRIAC also to fail as a short circuit.

It will be appreciated that although the invention has been described with particular reference to a railway control interlocking system, it is understood that it may be applied equally well to other forms of control.

Having thus described my invention, what I claim as new and desire to secure by Letters Patent is:

1. Apparatus for testing the operability of a semiconductive device comprising, means for injecting test pulses into a normal control signal to induce a momentary change of the operating state of said semiconductive device, sensing means connected in parallel with said semiconductive device sensitive to the induced change to produce a binary output sequence indicating the induced change, and correlation means operative to correlate the test pulses with the sensed response which is arranged to carry out a predetermined action in event that said correlation means determines a state of inoperability of said semiconductive device.

2. The apparatus as defined in claim 1, wherein said sensing means includes a light emitting diode which is connected in series with a current limiting resistor, both of which are connected across said semiconductive device.

3. The apparatus as defined in claim 2, wherein said correlation means includes a photoresponsive means which is responsive to the condition of said light emitting diode.

4. The apparatus as defined in claim 1, wherein said semiconductive device includes a switching element which is turned on and off.

5. The apparatus as defined in claim 4, wherein said switching element is connected in series with a transformer.

6. The apparatus as defined in claim 1, wherein said semiconductive device includes a TRIAC.

7. The apparatus as defined in claim 1, wherein said semiconductive device is connected in series with an a.c. voltage source.

8. The apparatus as defined in claim 2, said sensing means includes a current limiting resistor in series with said light emitting diode and an additional resistor in parallel with said light emitting diode.

9. The apparatus as defined in claim 1, wherein said sensing means includes a pair of light emitting diodes and said correlation means includes a pair of photoresponsive transistors.

10. The apparatus as defined in claim 1, wherein the secondary winding of said transformer is connected to a control device.

11. A vital circuit arrangement comprising, a pair of switching elements, means for generating and applying control signals to control terminals of the pair of switching elements, a transformer having its primary winding connected in series with said switching elements across a source of supply voltage, a pair of optical couplers connected to each of said switching elements, said transformer having a secondary winding coupled to a load which is energized when said switching elements are rendered conductive, and means to introduce test pulses into said switching elements to check the operability of said switching elements.

12. The vital circuit arrangement as defined in claim 11, wherein each of said switch elements is TRIAC.

13. The vital circuit arrangement as defined in claim 11, wherein each of said optical couplers includes a light emitting diode and a photoresponsive transistor.

14. The vital circuit arrangement as defined in claim 11, wherein a voltage divider is connected to each of said optical couplers.

15. The vital circuit arrangement as defined in claim 12, wherein said test pulses are periodically connected to the gate electrodes of said TRIACS.

16. The vital circuit arrangement as defined in claim 1, wherein each of said optical couplers includes a pair of reversely poled light emitting diodes.

17. The vital circuit arrangement as defined in claim 14, wherein said voltage divider includes a pair of resistors.

18. A circuit arrangement for testing the operability of electrical elements comprising, a first and a second TRIAC serially connected to the primary winding of a transformer, the secondary winding of said transformer is connected to a load which is energized when said first and second TRIACS are rendered conductive, a pair of reversely poled light emitting diodes connected across said first and second TRIACS, a pair of photoresponsive transistors optically coupled to a respective one of said pair of reversely poled diodes, and test pulses periodically applied to the gate electrodes of said first and second TRIACS to test their operability.

19. The circuit arrangement as defined in claim 18, wherein each of said pair of reversely poled diodes are connected across a resistor of a voltage divider.

20. The circuit arrangement as defined in claim 18, wherein a filter capacitor and a surge suppressor is connected across said secondary winding.

* * * * *